United States Patent [19]
Asada et al.

[11] Patent Number: 5,442,303
[45] Date of Patent: Aug. 15, 1995

[54] ELECTROMAGNETICALLY COUPLED FAIL-SAFE LOGIC CIRCUIT

[75] Inventors: Norihiro Asada; Masakazu Kato; Koichi Futsuhara, all of Urawa; Masayoshi Esashi, Sendai, all of Japan

[73] Assignee: The Nippon Signal Co., Ltd., Tokyo, Japan

[21] Appl. No.: 204,405

[22] PCT Filed: Jul. 16, 1992

[86] PCT No.: PCT/JP92/00911
§ 371 Date: Mar. 16, 1994
§ 102(e) Date: Mar. 16, 1994

[87] PCT Pub. No.: WO94/00292
PCT Pub. Date: Feb. 3, 1994

[51] Int. Cl.⁶ .................................... H03K 19/003
[52] U.S. Cl. ............................ 326/14; 326/31; 257/531
[58] Field of Search ............ 257/531; 307/442, 443, 307/279, 290; 326/14, 31

[56] References Cited

U.S. PATENT DOCUMENTS

| | | | |
|---|---|---|---|
| 3,423,728 | 1/1969 | Wissel | 307/442 X |
| 3,819,933 | 6/1974 | Grundy | 331/166 X |
| 3,913,023 | 10/1975 | Dolch | 307/442 |
| 3,953,747 | 4/1976 | Sekiguchi | . |
| 3,992,636 | 11/1976 | Kiffmeyer | 307/442 X |
| 4,130,764 | 12/1978 | Darrow | 307/442 |
| 4,587,077 | 5/1986 | Bessedine | . |
| 4,661,880 | 4/1987 | Futsuhara | 361/93 |
| 4,785,345 | 11/1988 | Rawls et al. | 257/531 |
| 5,065,047 | 11/1991 | Igari et al. | 307/442 |

FOREIGN PATENT DOCUMENTS

| | | |
|---|---|---|
| 2325247 | 6/1975 | France . |
| 54-7731 | 4/1979 | Japan . |
| 54-110424 | 8/1979 | Japan . |
| 56-19013 | 2/1981 | Japan . |
| 60-68719 | 4/1985 | Japan . |
| 62-163413 | 7/1987 | Japan . |
| 5-343245 | 12/1993 | Japan . |
| 93/23772 | 11/1993 | WIPO . |

*Primary Examiner*—David R. Hudspeth
*Attorney, Agent, or Firm*—Lowe, Price, Leblanc & Becker

[57] ABSTRACT

A fail-safe logic circuit employs a transformer (T) and a level tester (1). The transformer receives input signals each representing a binary logic variable and provides the sum of magnetic flux based on the input signals. The level tester tests the level of the sum of the magnetic flux and provides a binary output (y) representing a logic value of 1 or 0. This circuit is simple and capable of lowering an output level.

15 Claims, 9 Drawing Sheets

ELECTROMAGNETICALLY COUPLED FAIL-SAFE LOGIC CIRCUIT

TECHNICAL FIELD

The present invention relates to an electromagnetically coupled fail-safe logic circuit that is integrated (compact) and capable of providing a low-potential output.

BACKGROUND ART

An example of a fail-safe logic circuit is disclosed in "Fail-Safe Scan Circuit" (PCT/JP92/00631) proposed by the present inventors.

This circuit employs a plurality of AC input signals each representing a binary value, i.e., a logic value of 1 (with an output) or 0 (with no output). The signals never take the logic value 1 by error when failure occurs. The levels of these AC input signals are rectified, added up, and converted into a multilevel signal according to the number of the input signals by an adder. The adder employs a voltage doubler rectifier that includes a coupling capacitor, a clamp diode, a rectifier diode, and a smoothing capacitor. The level of the multilevel signal is tested by a fail-safe threshold operation element such as a fail-safe window comparator of which output signal is zero (corresponding to the logic value 0) when failure occurs. The threshold operation element provides a binary output signal representing the logic value 0 or 1 based on the level result.

The sum of a plurality of binary input signals $P_i$ ($i=1$ to n) is expressed as $P_1+P_2+\ldots+P_n$. The logical product and logical sum operations of these input signals are expressed as follows with an operation output of h:

Logical product operation $$h = 1 \quad \max \sum_{i=1}^{n} P_i$$

$$h = 0 \quad \sum_{i=1}^{n} P_i < \max \sum_{i=1}^{n} P_i$$

Logical sum operation $$h = 1 \quad \max \sum_{i=1}^{n} P_i \geq 1$$

$$h = 0 \quad \sum_{i=1}^{n} P_i = 0$$

When calculating the logical product of the binary signals $P_i$, the threshold of the threshold operation element must be set to provide the output h of 1 if each of the input signals $P_i$ indicates the logic value 1. When calculating the logical sum of the signals, the threshold of the threshold operation element must be set to provide $h=1$ if any one of the input signals $P_i$ indicates the logic value 1.

This fail-safe logic circuit has the following three characteristics:

Firstly, the same circuit is applicable to calculating logical product and logical sum because the circuit is programmable to select any one of the logical operations according to the setting of the threshold. Secondly, a logic value representing the sum $P_1+P_2\ldots+P_n$ of the binary input signal $P_i$ errs in the direction of decrease, further, the threshold operation element never provides an output representing the logic value 1 even if failure such as short circuit or disconnection occurs in one of the capacitors and diodes in the voltage doubler rectifier. Accordingly, the circuit never erroneously provides an output representing the logic value 1 even if there is no input signal $P_i$. Thirdly, the circuit calculates the sum of the input signals $P_i$ each never erring to the logic value 1, converts the sum into a multilevel value that never errs to increases, and carries out the threshold operation that never errs to the logic value 1, to provide a binary signal. Due to these characteristics, a plurality of the logic circuits may be connected in cascade to carry out fail-safe logic operations.

In this logic circuit, the level of a binary input signal representing the logic value 1 is actually provided by power source potential Vcc. Accordingly, if the coupling capacitor causes a short-circuit failure, there will be a risk of transmitting the power source potential Vcc to the output side even if the signals do not represent the logic value 1. To secure the fail-safe property of the logic circuit, it is necessary to employ the clamp diode to make the minimum potential of the sum $P_1+P_2+\ldots+P_n$ of the input signals equal to the power source potential Vcc. (This technique is called the power source outside process.) This power source outside process is troublesome and complicates the circuit. In addition, the clamping may increase the potential of the summed output.

The logic circuit mentioned above accumulates the outputs of the binary input signals as charges in the capacitors and adds them up. Accordingly, there is a limit on minimizing (integrating) the logic circuit.

The present inventors have proposed a very small transformer (Japanese Unexamined Patent Publication No. 5-343245). This transformer is formed by a semiconductor manufacturing process technique. A plurality of coils insulated from one another are formed as film patterns by evaporation or spattering on an insulation substrate, to form the transformer.

An object of the present invention is to provide a fail-safe logic circuit that employs magnetic flux produced by coils, to carry out logic operations on input signals. This technique is capable of providing an output of low potential and integrating the logic circuit.

DISCLOSURE OF THE INVENTION

An arrangement according to the present invention employs a transformer and a level tester. The transformer includes a plurality of primary coils and a secondary coil. The primary coils are electromagnetically coupled to one another to receive a plurality of AC input signals, respectively. The AC input signals are in synchronism with one another and each representing a binary logic variable, i.e., a logic value of 1 corresponding to a high energy state or a logic value of 0 corresponding to a low energy state. The secondary coil is electromagnetically coupled with all of the primary coils, to provide an output corresponding to the sum of magnetic flux produced by the primary coils. The level tester tests the output level of the secondary coil, and according to the output level, provides an output representing the logic value 1 corresponding to the high energy state or the logic value 0 corresponding to the low energy state. The level tester provides an output representing the logic value 0 if failure occurs.

According to this arrangement, the electromagnetically coupled transformer provides the sum of the input signals representing binary logic values, and the level tester tests the level of the sum and provides an output signal representing a binary logic value. Compared with the adder arrangement employing capacitors, this arrangement provides fail-safe characteristics without employing the power source outside process. Accordingly, this arrangement can lower the potential of the logic operation output.

The level tester may be a Schmitt circuit for carrying out a threshold operation, or a window comparator for carrying out a window operation.

The transformer may be made of a plurality of primary coils formed of film patterns that are covered with insulation material, insulated from one another, and laminated one upon another on an insulation substrate, a secondary coil formed of a film pattern that is covered with insulation material, insulated from the primary coils, and formed on the insulation substrate, and a magnetic layer covering the laminated primary coils and the secondary coil. This transformer is very small so that the logic circuit can be further integrated.

The laminated primary coils of the transformer may be arranged such that one terminal of each of the primary coils is kept at constant potential, the other terminal thereof receives an input signal, and the constant potential terminal of one of the adjacent primary coils and the input signal receiving terminal of the other of the adjacent primary coils are laid one upon another. According to this arrangement, a plurality of the primary coils will not be excited with a single input signal even if the adjacent upper and lower primary coils cause a short-circuit failure.

Many transformers may be arranged on an insulation substrate. In this case, presser plates are employed. The presser plates have magnetic layers for covering the primary and secondary coils of the transformers. The number of the magnetic layers corresponds to the number of the transformers. The presser plates are fitted to the insulation substrate from above and below the substrate, to cover the coils. This arrangement can reduce the manufacturing cost of the circuit.

A logic circuit according to the present invention has an input signal processor and a level tester. The input signal processor has coupled transformers for receiving a plurality of AC input signals each representing a binary logic variable, i.e., a logic value of 1 corresponding to a high energy state and a logic value of 0 corresponding to a low energy state. The input signals are divided into two groups and are in synchronism with one another. The input signal processor provides a first output signal according to the sum of in-phase magnetic flux based on the respective input signals of one group, and a second output signal according to the sum of in-phase magnetic flux based on the respective input signals of the other group. The phase of the second output signal is opposite to that of the first output signal. The level tester tests the levels of the first and second output signals, and according to a result of the test, provides an output representing the logic value 1 corresponding to the high energy state or the logic value 0 corresponding to the low energy state. The level tester provides an output representing the logic value 0 if failure occurs.

According to this arrangement, various logic operations such as logical product and logical sum operations are achievable by changing combinations of turns of the coils of the transformer.

Another logic circuit according to the present invention has an input signal processor for receiving a plurality of AC input signals and a level tester. The input signals represent each a binary logic variable, i.e., a logic value of 1 corresponding to a high energy state or a logic value of 0 corresponding to a low energy state, divided into two groups, modulated with a common carrier signal, and are synchronous with one another. The input signal processor includes fourth and fifth transformers. The fourth transformer includes a third primary coil group, a fourth primary coil group, a carrier signal receiving primary coil, and a secondary coil. The third primary coil group receives the respective input signals of one group and provides the sum of in-phase magnetic flux based on the input signals. The fourth primary coil group receives the respective input signals of the other group and provides the sum of magnetic flux based on the input signals. The phase of the magnetic flux provided by the fourth primary coil group is opposite to that provided by the third primary coil group. The carrier signal receiving primary coil receives the carrier signal and produces magnetic flux whose phase is the same as that provided by the third primary coil group. The secondary coil is electromagnetically coupled with all of the primary coils and generates an output whose phase is the same as that of the magnetic flux provided by the third primary coil group. The fifth transformer includes a fourth primary coil group, a fifth primary coil group, a carrier signal receiving primary coil, and a secondary coil. The fourth primary coil group receives the respective input signals of one group, respectively, and provides the sum of magnetic flux whose phase is the same as that provided by the third primary coil group of the fourth transformer. The fifth primary coil group receives the respective input signals of the other group and provides the sum of magnetic flux whose phase is opposite to that provided by the fourth primary coil group. The carrier signal receiving primary coil receives the carrier signal and produces magnetic flux whose phase is the same as that provided by the fifth primary coil group. The secondary coil is electromagnetically coupled with all of the primary coils and provides the sum of magnetic flux of the primary coils in the same phase as that provided by the secondary coil of the fourth transformer. Output ends of the fourth and fifth transformers are connected to each other in a wired OR arrangement. The level tester tests the level of the wired OR output of the input signal processor, and according to the output level, provides an output representing the logic value 1 corresponding to the high energy state or the logic value 0 corresponding to the low energy state. The level tester provides an output representing the logic value 0 if failure occurs.

According to this arrangement, the input signal processor provides an in-phase output irrespective of the phases of the input signal groups. Namely, the phase of an output signal provided by a given logic circuit to the next logic circuit is always the same irrespective of the phases of input signals to the given logic circuit. This arrangement is advantageous in connecting logic circuits in cascade.

BEST MODE OF CARRYING OUT THE INVENTION

Logic circuits according to the embodiments of the present invention will be explained in detail with reference to the drawings.

Figure 1:
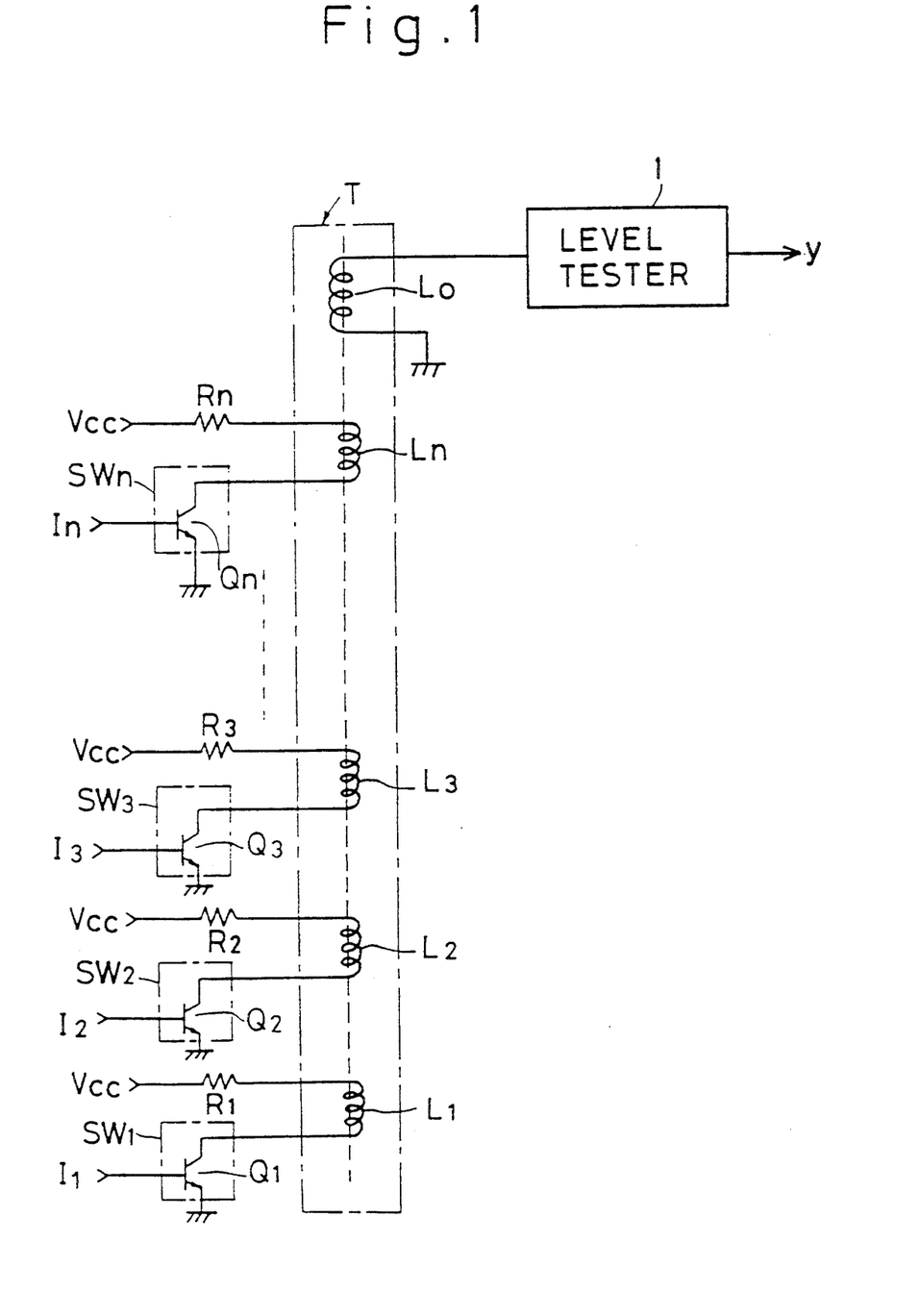
FIG. 1 shows a first embodiment of a logic circuit according to the present invention.

FIG. 1 shows a logic circuit according to the first embodiment of the present invention.

The logic circuit has a transformer T, switch circuits SW1 to SWn for exciting the transformer T, and a level tester 1 for testing the level of a secondary output of the transformer T.

The transformer T has a plurality of primary coils, for example, n primary coils $L_1$ to $L_n$ electromagnetically coupled together and a secondary coil $L_0$ electromagnetically coupled with the primary coils $L_1$ to $L_n$. One ends of the primary coils $L_1$ to $L_n$ are connected to constant potential such as power source potential Vcc. The other ends of the primary coils $L_1$ to $L_n$ are connected to the switch circuits $SW_1$ to $SW_n$, respectively. The switch circuits $SW_1$ to $SW_n$ are made of transistors $Q_1$ to $Q_n$, respectively. In response to the ON and OFF operations of the respective switch circuits $SW_1$ to $SW_n$, the primary coils $L_1$ to $L_n$ are energized to generate magnetic flux in the same direction. The simultaneously produced magnetic flux is added up. The secondary coil $L_0$ produces an output corresponding to the sum of the magnetic flux. Reference marks $R_1$ to $R_n$ are current-limiting resistors acting on currents flowing to the primary coils $L_1$ to $L_n$.

The level tester 1 is made of, for example, an amplifier and a Schmitt circuit, to test the output level of the secondary coil $L_0$ of the transformer T, and according to the output level, provide a binary output signal y representing a logic value of 1 or 0.

The transformer T may have a magnetic core for coupling the coils, or an air-core.

The switch circuits $SW_1$ to $SW_n$ receive input signals $I_1$ to $I_n$, respectively. The input signals are synchronous AC signals each being a binary signal representing the logic value 1 (corresponding to a high energy state) or 0 (corresponding to a low energy state). When the input signal represents the logic value 1 (when an AC signal is provided), the switch circuit carries out ON/OFF operations to cause the primary coil to generate magnetic flux.

Figure 2:
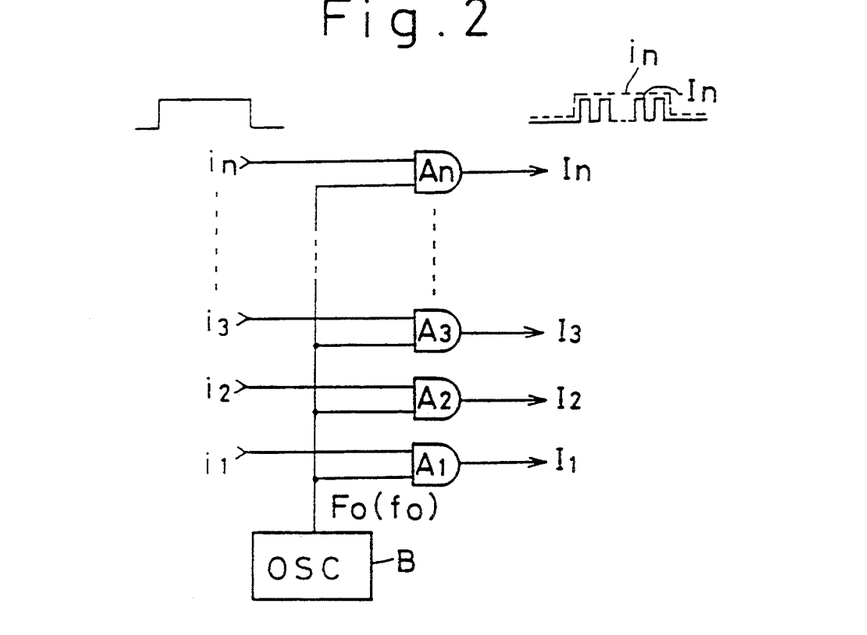
FIG. 2 shows an input signal forming circuit according to the embodiment.

The input signal $I_1$ to $I_n$ are produced by, for example, an input signal generator shown in FIG. 2.

This signal generator has "n" AND gates $A_1$ to $A_n$ and a signal generator B for generating a carrier signal $F_0$ of predetermined frequency $f_0$.

One ends of the AND gates $A_1$ to $A_n$ receive binary rectangular signals $i_1$ to $i_n$, respectively. Each of the rectangular signals represents logic values 1 and 0. The other input terminals of the AND gates receive the carrier signal $F_0$ from the signal generator B. When the rectangular signals $i_1$ to $i_n$ represent the logic value 1, the AND gates modulate the rectangular signals with the frequency $f_0$ of the carrier signal $F_0$ and provide the AC signals $I_1$ to $I_n$ that are in synchronism with one another and represent the logic value 1.

If the rectangular signals $i_1$ to $i_n$ have sufficient frequencies to cause the primary coils $L_1$ to $L_n$ of the transformer T to generate magnetic flux, the signals $i_1$ to $i_n$ may be used as the input signals $I_1$ to $I_n$ and directly provided to the switch circuits $SW_1$ to $SW_n$.

The operation of the logic circuit will be explained.

When the input signals $I_1$ to $I_n$ of logic value 1 are supplied to turn on and off the switch circuits $SW_1$ to $SW_n$, the primary coils $L_1$ to $L_n$ of the transformer T are excited to generate magnetic flux in the same direction. The magnetic flux is added up, and the secondary coil $L_0$ produces an output voltage corresponding to the sum of the magnetic flux produced in the primary coils $L_1$ to $L_n$. The output voltage of the secondary coil $L_0$ is received by the level tester 1. If the output voltage is higher than or equal to a threshold set in the level tester 1, the level tester 1 produces an AC output to provide an output signal y representing the logic value 1. If the output voltage is less than the threshold, the level tester 1 produces no output to provide an output signal y representing the logic value 0.

Selecting the threshold of the level tester 1 achieves a logical product operation or a logical sum operation.

The primary coils $L_1$ to $L_n$ generate magnetic flux $\phi i (i=1$ to $n)$ in response to the input signals $I_1$ to $I_n$. The magnetic flux is represented with the binary logical value 1 or 0 (li = 1 corresponds to $\phi i = 1$). The threshold represents the logical level of the sum of the magnetic flux.

For the logical product operation, the threshold S is set as $S = \phi 1 + \phi 2 + \ldots \phi n$. Only when all of the input signals $I_1$ to $I_n$ are simultaneously provided, the output signal y of the level tester 1 becomes 1. If any one of the input signals $I_1$ to $I_n$ is not provided, the output signal y becomes 0. In this way, the logical product operation of the input signals $I_1$ to $I_n$ can be achieved.

For the logical sum operation, the threshold S is set as $S = 1$ ($\phi i \neq 0$). When any one of the input signals $I_1$ to $I_n$ is provided, the output signal y of the level tester 1 becomes 1, and none of the input signal $I_1$ to $I_n$ is provided, the output signal y becomes 0. In this way, the logical sum operation of the input signals $I_1$ to $I_n$ can be achieved.

The threshold operation may be carried out by a Schmitt circuit. In this case, unlike an adder circuit employing capacitors, a process of clamping power source potential and the power source outside process are not required. It is possible to appropriately select the number of windings of the secondary coil $L_0$, to lower the input level (potential) of the threshold operation circuit. The Schmitt circuit is capable of maintaining the frequency of an input signal and transferring the same to the next stage. Accordingly, when a plurality of logic circuits are connected in cascade, the output of a given logic circuit can be used as it is as an input signal to a logic circuit in the next stage.

Figure 3:
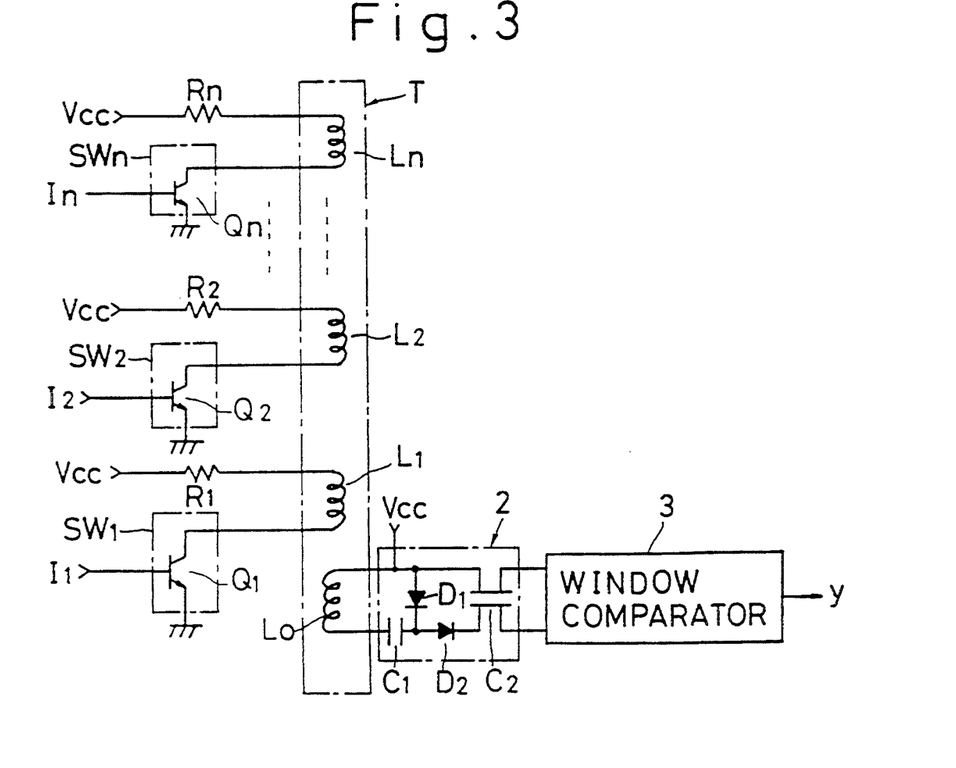
FIG. 3 shows a second embodiment of the logic circuit according to the present invention.

FIG. 3 shows the second embodiment.

The logic circuit of FIG. 3 employs a fail-safe window comparator as a level tester. This window comparator is a known one (U.S. Pat. No. 4,661,880, etc.).

To carry out the threshold operation with use of the window comparator, the output of a secondary coil $L_0$ of a transformer T must be rectified into a direct current. Accordingly, this embodiment arranges a voltage doubler rectifier 2 between the secondary coil $L_0$ and the input side of the window comparator 3. The voltage doubler rectifier 2 involves two diodes $D_1$ and $D_2$, a 2-terminal capacitor $C_1$, and a 4-terminal capacitor $C_2$. The voltage doubler rectifier 2 and window comparator 3 form the level tester.

According to the logic circuit of this arrangement, the window comparator has a lower limit threshold $\phi_L$ ($\phi_L > VCC$) and an upper limit threshold $\phi_H (\phi_H > \phi_L)$. When $\phi_L \leq \phi_1 + \phi_2 + \ldots + \phi_n \leq \phi_H$, output signal y of the window comparator 3 corresponding to the level tester 1 becomes 1, and when $\phi_1 + \phi_2 + \ldots + \phi_n < \phi_L$ or $\phi_1 + \phi_2 + \ldots + \phi_n > 1\phi_H$, the output signal y becomes 0.

The details of the transformer of the logic circuit according to the present invention will be explained with reference to FIGS. 4 to 7.

Figure 4A:
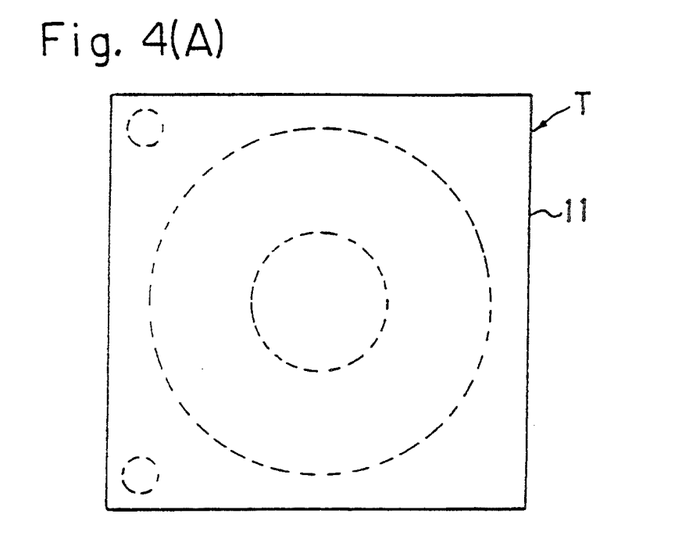
FIG. 4 shows a first embodiment of a transformer employed by the logic circuit according to the present invention, (in with (A) is a plan view and (B) is a sectional view)
Figure 4B:
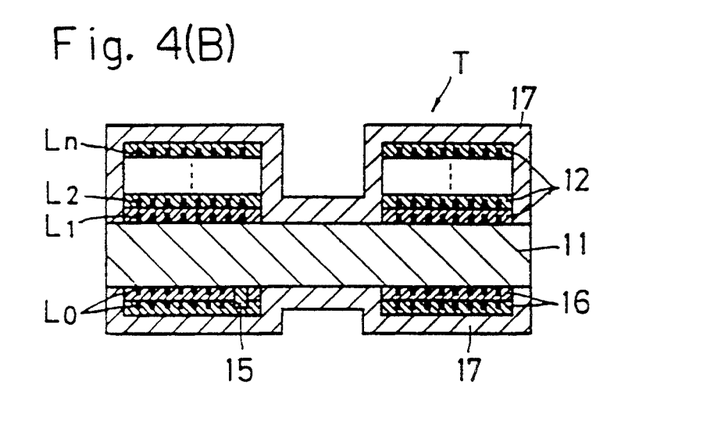

FIGS. 4(A) and 4(B) are a plan view and a sectional view showing the transformer.

Figure 5A:
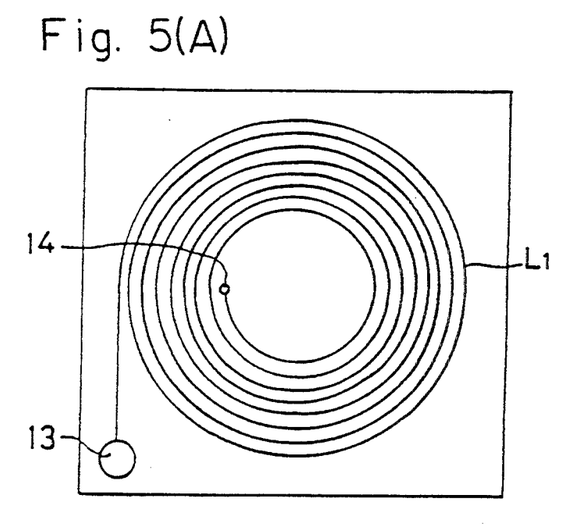
FIG. 5 shows the winding of a primary coil of the transformer, in which (A) shows a first layer of the primary coil and (B) shows a second layer of the primary coil.
Figure 5B:
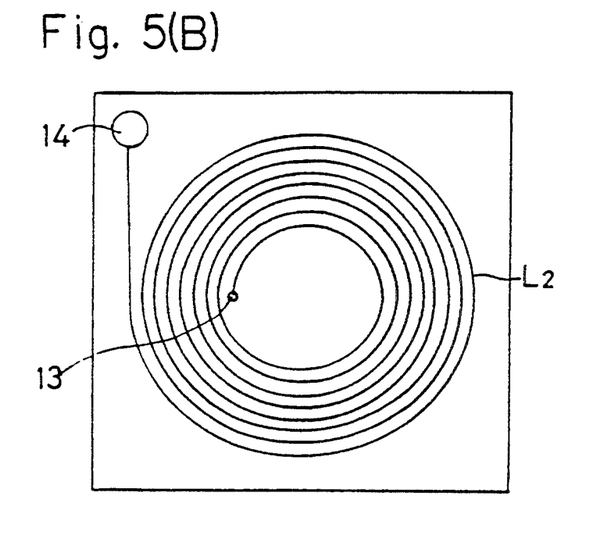
Figure 6A:
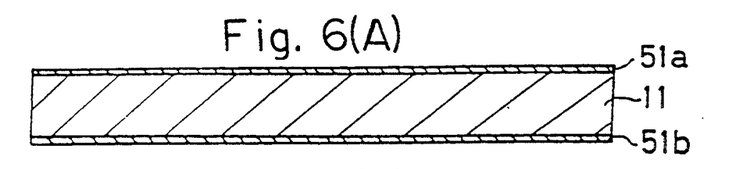
FIG. 6 shows processes of fabricating the transformer.
Figure 6B:
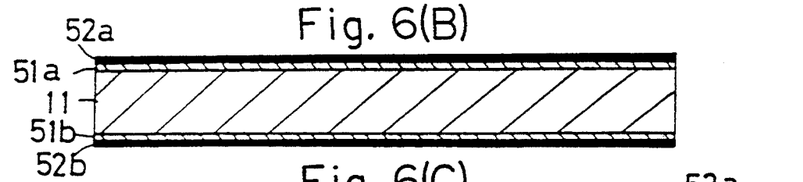
Figure 6C:
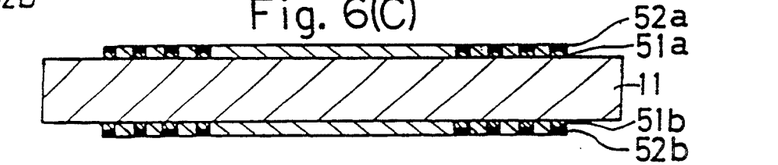
Figure 6D:
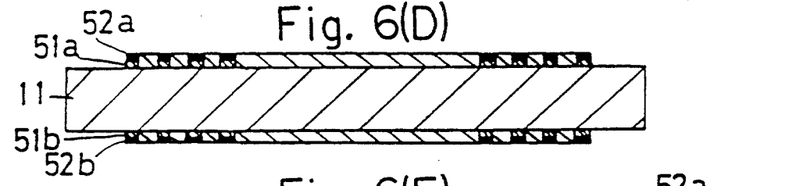
Figures 6E, 6F:
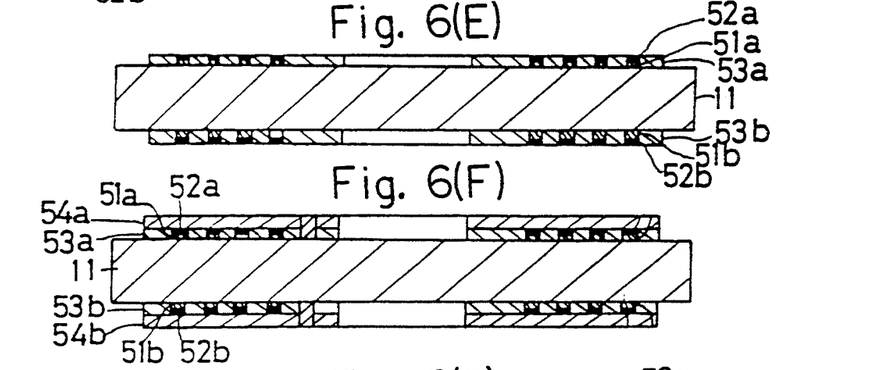
Figure 6G:
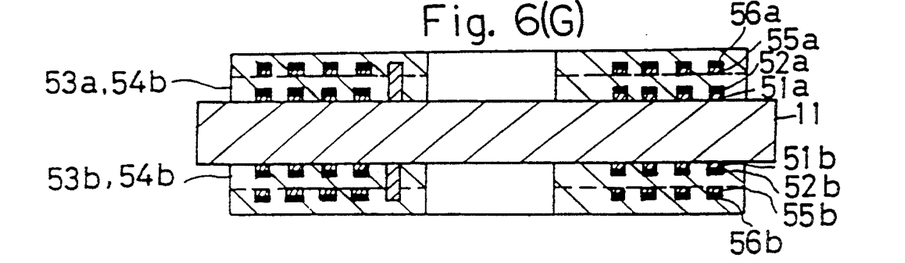

An insulation substrate 11 is made from quartz glass, ceramics, etc., and has flat faces. The thickness of the substrate is, for example, about 200 micrometers. On the upper face of the insulation substrate 11, n primary coils $L_1$ to $L_n$ are formed as film patterns by, for example, copper plating. The primary coils are entirely covered with insulation layers 12. Namely, the primary coils are insulated from one another and laminated one upon another. In FIGS. 5(A) and 5(B), the primary coil $L_1$ in the first layer has a terminal (hot line) 13 on the outer side. The terminal 13 is connected to a corresponding one of the switch circuits $SW_1$ to $SW_n$ and receives the input signal $I_1$. The primary coil $L_1$ also has a terminal 14 on the inner side, to receive the power source potential Vcc. The primary coil $L_1$ is wound clockwise from the terminal 13 to the terminal 14. On the other hand, the primary coil $L_2$ of the second layer has the input terminal 13 for receiving the input signal 12 on the inner side, and the terminal 14 for receiving the power source potential Vcc on the outer side. Similar to the primary coil $L_1$ in the first layer, the primary coil $L_2$ is wound clockwise from the terminal 13 to the terminal 14. Due to this arrangement, the primary coils $L_1$ to $L_n$ produce magnetic flux in the same direction, and the magnetic flux is added up. The primary coils $L_1$ to $L_n$ are laminated such that the input signal terminals 13 and power source potential terminals 14 are alternately laid one upon another.

On the lower face of the insulation substrate 11, the secondary coil $L_0$ is laminated in, for example, two layers. The two layers are connected to each other through a connection terminal 15, to thereby form the single secondary coil $L_0$. Numeral 16 is an insulation layer. The insulation layers 12 around the primary coils $L_1$ to $L_n$ and the insulation layers 16 around the primary coil $L_0$ are entirely covered with a magnetic layer 17. The magnetic layer 17 is made from, for example, Permalloy, that shows low loss and provides high magnetic permeability.

Processes of fabricating the transformer T will be explained with reference to FIG. 6.

Nickel is spattered on each face of an insulation substrate 11, to form nickel layers 51a and 51b each of about 0.05 micrometers thick. (Process 1)

Electrolytic copper plating is carried out to form copper layers 52a and 52b each of about 1.0 micrometer thick. (Process 2)

Parts where coils are formed are masked with, for example, positive resist. Copper etching is carried out with use of ferric chloride. Nickel etching is carried out with use of nickel removing liquid. After etching, the resist is removed to form copper layers 52a and 52b corresponding to the primary coil $L_1$ and the first layer of the secondary coil $L_0$. (Process 3)

Electrolytic copper plating is carried out to entirely cover the nickel layers 51a and 51b with copper. (Process 4)

Except for the copper layers 52a and 52b, negative plating resists 53a and 53b are coated, and then electrolytic copper plating is carried out to thicken the copper layers 52a and 52b. As a result, film patterns for the primary coil $L_1$ and the first layer of the secondary coil $L_0$ are formed. (Process 5)

Insulation layers 54a and 54b made of, for example, photosensitive polyimide are formed to cover the copper layers 52a and 52b. The plating resists 53a and 53b and insulation layers 54a and 54b correspond to the insulation layers 12 and 16. (Process 6)

In this way, forming of the primary coil $L_1$ and the first layer of the secondary coil $L_0$ are completed.

The processes 1 to 6 are repeated to form the primary coil $L_2$ and the second layer of the secondary coil $L_0$. Numerals 55a and 55b are nickel layers and 56a and 56b are copper layers. The copper layer 55a and nickel layer 56a correspond to the primary coil $L_2$ in the second layer. The copper layer 55b and nickel layer 56b correspond to the second layer of the secondary coil $L_0$. (Process 7) When forming the first layer of the secondary coil $L_0$, part corresponding to the connection terminal 15 must not be covered with the insulation layer 54b in the process 6.

The processes 1 to 6 are repeated on the primary coil side, to form the primary coils $L_3$ to $L_n$.

After all coils are formed, the primary and secondary coils are entirely covered with magnetic material such as Permalloy, to form the magnetic layer 17.

According to the transformer T of this arrangement, each coil is formed by copper plating, so that each coil may have a large sectional area to supply large electric power from the primary side to the secondary side. Since the coils are covered with the magnetic layer 17 having high magnetic permeability, magnetic flux will not leak, to thereby improve power conversion efficiency. Compared with an adder circuit employing capacitors and diodes, the logic circuit employing the transformer T can be more compact and integrated.

In the lamination of the primary coils, the input signal terminals 13 and power source potential terminals 14 are alternately laid one upon another. When vertically adjacent coils are short-circuited, this arrangement prevents a plurality of the primary coils from being excited by a single input signal. A constant potential line such as a power source potential line or a ground line may be interposed between the laminated adjacent primary coils, so that coils are always connected to the constant potential line when the insulation of the adjacent coils is broken. In this case, a plurality of the primary coils are also prevented from being excited by a single input signal.

The primary and secondary coils are formed on the opposite sides of the insulation substrate 11. This arrangement prevents the primary side from being shodcircuited to the secondary side. Namely, input signals to the primary side will never directly appear as an output signal of the secondary side. The insulation substrate 11 forms an air gap in a closed magnetic path in the magnetic layer 17, so that the transformer is hardly saturated.

Figure 7:
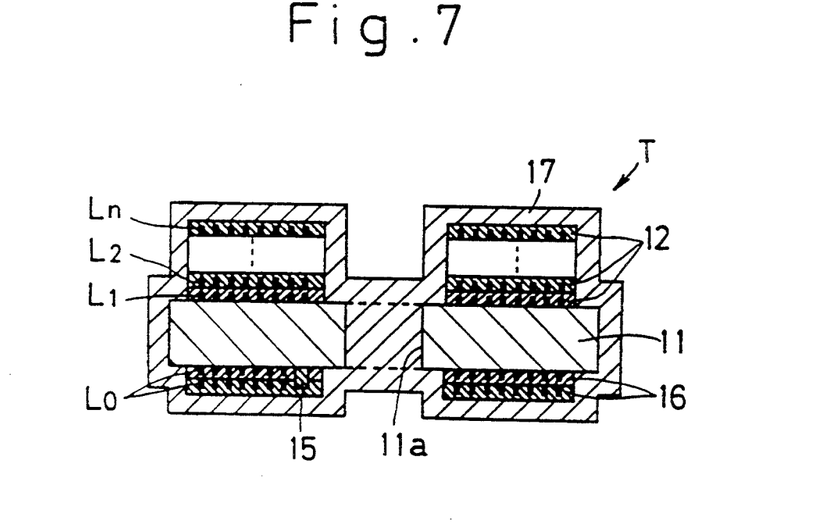
FIG. 7 is a section showing another embodiment of the transformer.

The magnetic layer 17 may be made from ferrite. The ferrite has lower magnetic permeability than the Permalloy. Accordingly, the insulation substrate 11 is provided with a center through hole 11a as shown in FIG. 7, and the magnetic layer 17 is formed to cover the side faces and through hole 11a of the insulation substrate 11, to provide sufficient power conversion efficiency.

The primary and secondary coils may be laminated on one face of an insulation substrate. The magnetic layer 17 for covering the coils is not always needed. It is, however, preferable to form the magnetic layer 17 to reduce the leakage of magnetic flux.

A 2-wire sign tester employing the logic circuit according to the present invention will be explained.

Figure 8:
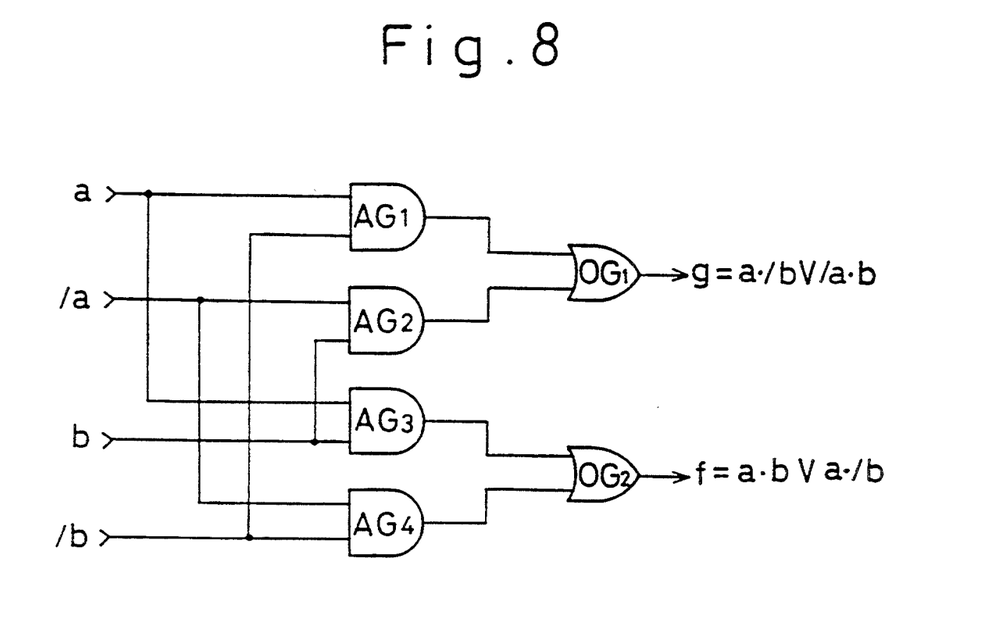
FIG. 8 shows a principle of a 2-wire sign tester.

The principle of the 2-wire sign tester will be explained with reference to FIG. 8.

Predetermined combinations of two pairs of binary signals /a and a, and /b and b are provided to four AND gates $AG_1$ to $AG_4$. The reference mark "/" indicates negation. The AND gate $AG_1$ receives the signals a and /b, the AND gate $AG_2$ receives the signals /a and b, the AND gate $AG_3$ receives the signals a and b, and the AND gate $AG_4$ receives the signals /a and /b. Outputs of the AND gates $AG_1$ and $AG_2$ are provided to an OR gate $OG_1$, and outputs of the AND gates $AG_3$ and $AG_4$ are provided to an OR gate $OG_2$.

Accordingly, an output g of the OR gate $OG_1$ is the logical sum (a·/b v/a·b) of the logical product (a·/b) of the signals a and /b and the logical product (/a·b) of the signals /a and b. An output f of the OR gate $OG_2$ is the logical sum (a·b v/a·/b) of the logical product (a·b) of the signals a and b and the logical product (/a·/b) of the signals /a and /b.

When the signals are correctly combined so that the signals /a and b are 0 when the signals a and b are 1, and when the signals a and b are 0, the signals /a and /b are 1, the outputs (f, g) will be (1, 0) or (0, 1). If the signals are differently combined other than the combination mentioned above (to indicate abnormality), the outputs (f, g) will be (1, 1) or (0, 0). Accordingly, it is possible to determine whether or not the input signals are normal according to the statuses of the outputs f and g.

Figure 9A:
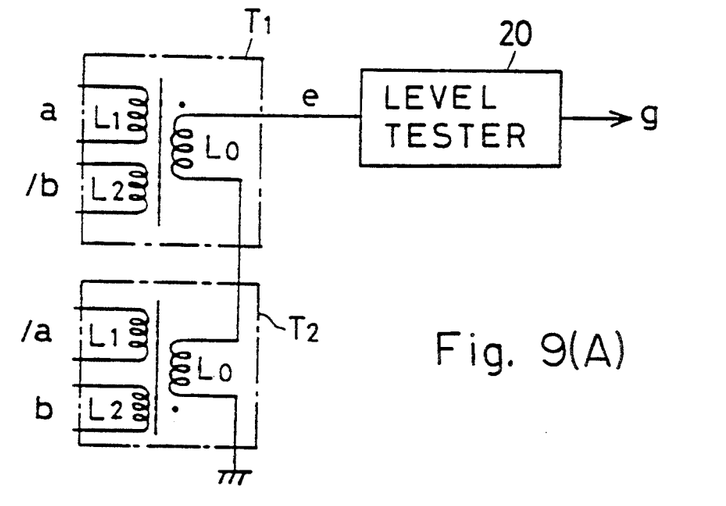
FIG. 9 shows a circuit diagram of a first embodiment of the 2-wire sign tester employing the logic circuit according to the present invention.
Figure 9B:
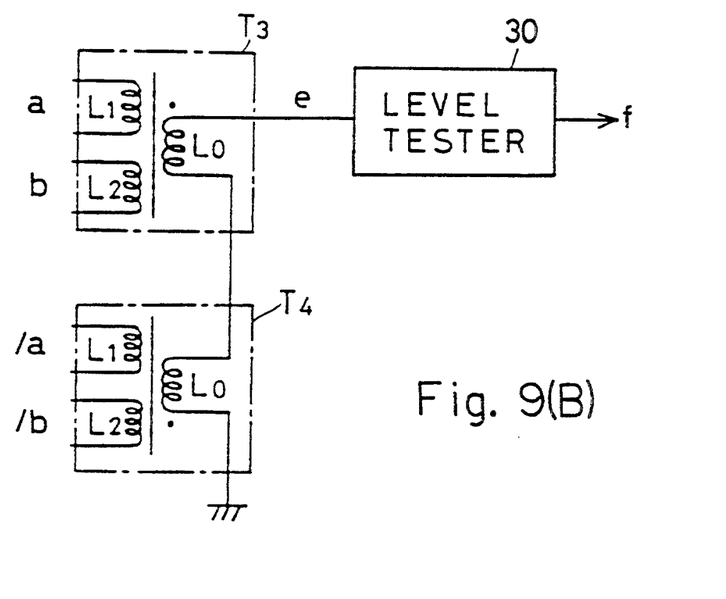
Figure 10A:
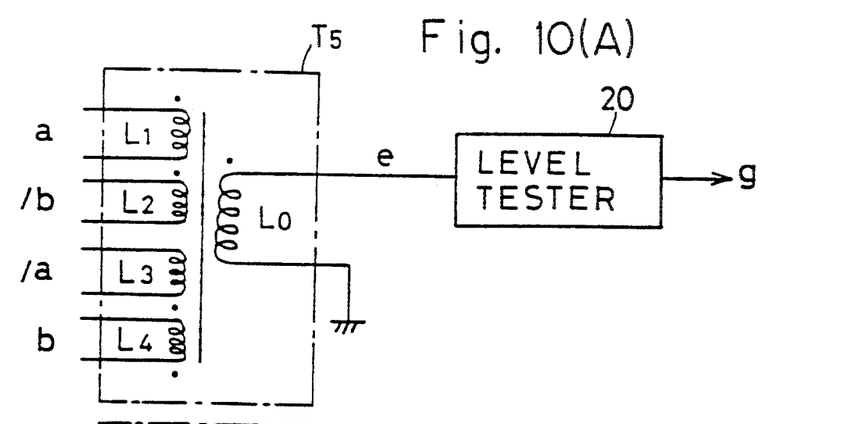
FIG. 10 shows a circuit diagram of a second embodiment of the 2-wire signal tester employing the logic circuit according to the present invention.
Figure 10B:
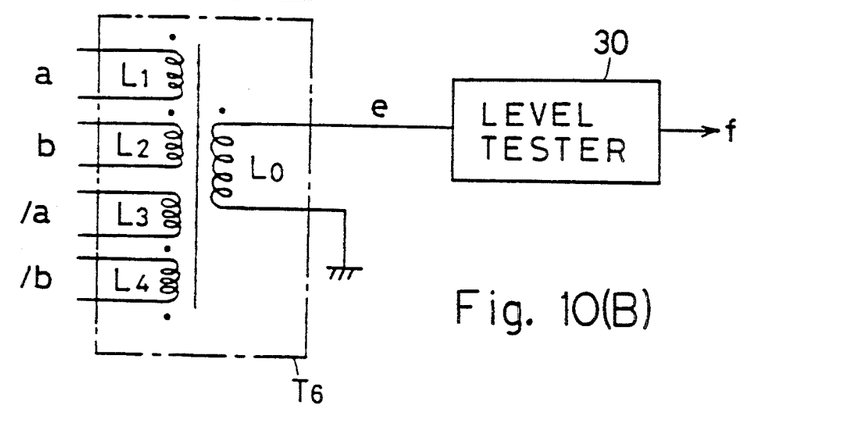
Figure 11A:
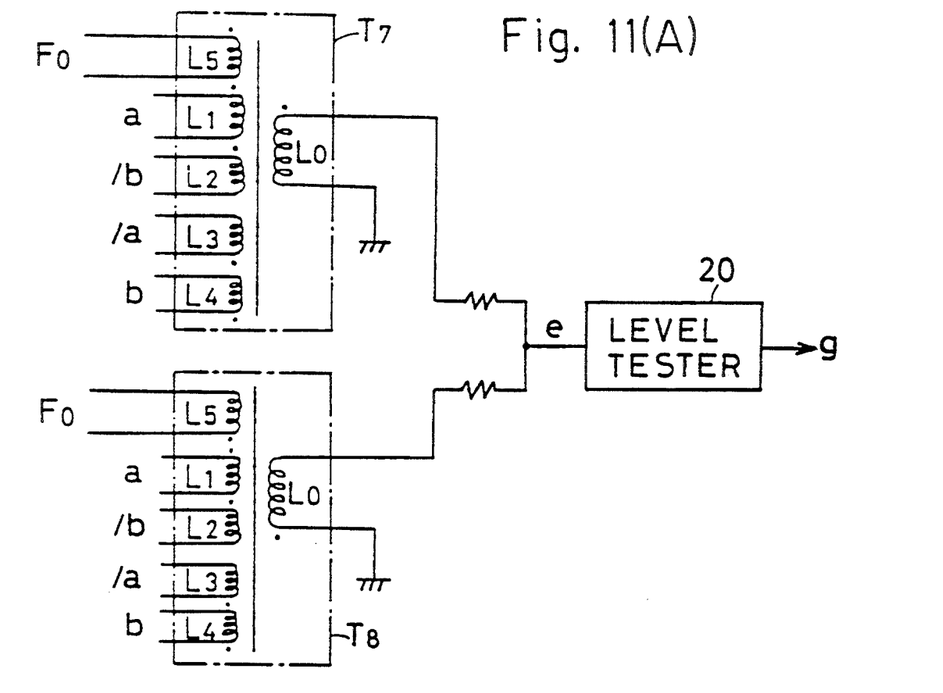
FIG. 11 shows a circuit diagram of a third embodiment of the 2-wire signal tester employing the logic circuit according to the present invention.
Figure 11B:
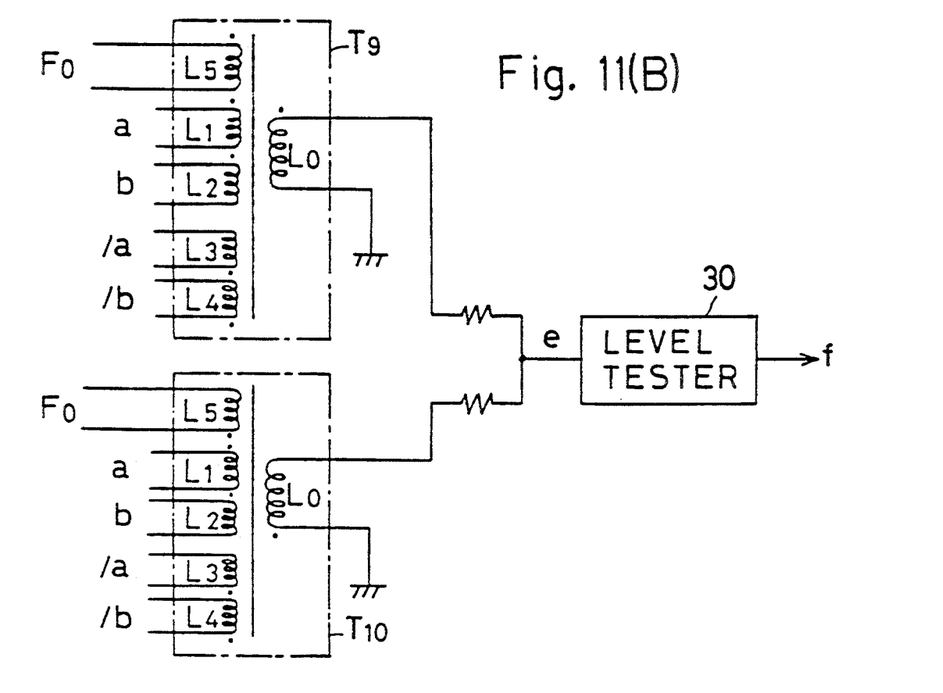

FIGS. 9 to 11 show 2-wire sign testers employing logic circuits with the transformer mentioned above.

FIG. 9 shows a first embodiment. This embodiment involves four transformers $T_1$ to $T_4$ each including two primary coils $L_1$ and $L_2$ and a secondary coil $L_0$, which provides an output in response to the sum of magnetic flux of the primary coils $L_1$ and $L_2$, and two level testers 20 and 30. The level testers 20 and 30 are Schmitt circuits.

The transformer $T_1$ receives signals a and /b, the transformer $T_2$ receives signals /a and b, the transformer $T_3$ receives signals a and b, and the transformer $T_4$ receives signals /a and /b. Namely, the transformer $T_1$ corresponds to the AND gate $AG_1$, the transformer $T_2$ corresponds to the AND gate $AG_2$, the transformer $T_3$ corresponds to the AND gate $AG_3$, and the transformer $T_4$ corresponds to the AND gate $AG_4$. The secondary coils $L_0$ of the transformers $T_1$ and $T_2$ are oppositely wound to each other and connected in series between the level tester 20 and the ground. Similarly, the secondary coils $L_0$ of the transformers $T_3$ and $T_4$ are oppositely wound to each other and connected in series between the level tester 30 and the ground. The transformers $T_1$ and $T_2$ generate first and second output signals having opposite phases. Similarly, the transformers $T_3$ and $T_4$ generate output signals having opposite phases. The transformers $T_1$ and $T_3$ form a first transformer, and the transformers $T_2$ and $T_4$ form a second transformer. The transformers $T_1$ ($T_3$) and $T_2$ ($T_4$) form an input signal processor.

The operation of the embodiment will be explained.

The input signals a, /a, b, and /b represent each a binary value (1, 0). The sum of magnetic flux of these input signals forms a secondary output signal e. When there are two inputs, e=2. When there is an input, e=1. When there is no input, e=0. Output signals g and f of the level testers 20 and 30 represent each a binary logic value of 1 when an AC signal is generated, or 0 when no AC signal is generated. When e=2, g=1 and f=1. When e<2, g=0 and f=0.

When the signals a and b have the same value, i.e., (1, 1) or (0, 0) and when the signals are normal, the signals /a and /b will be (0, 0) or (1, 1). In the former case, the primary coils $L_1$ and $L_2$ of the transformer $T_3$ receive each 1, and the sum of magnetic flux for a=1 and b=1 causes the secondary coil $L_0$ to provide an output of e=2. The primary coils $L_1$ and $L_2$ of the transformer $T_4$ receive no input, so that the secondary coil $L_0$ thereof provides no output signal, i.e., e=0. As a result, the level tester 30 receives e=2, and the output signal f is 1.

On the other hand, one input signal of each of the transformers $T_1$ and $T_2$ is 1, and therefore, the secondary coil $L_0$ thereof provides e=1. Since the secondary coils $L_0$ of the transformers $T_1$ and $T_2$ are oppositely wound to each other, the output signals of the respective secondary coils $L_0$ cancel each other due to the opposite phases. As a result, the input level of the level tester 20 becomes e=0, and therefore, provides g=0. Namely, the output g and f of the level testers 20 and 30 take different values, to indicate that the input signals are normal.

In the latter case, the output signal of the transformer $T_4$ becomes e=2, and the output signal of the transformer $T_3$ becomes e=0. Similar to the former case, the output signals of the level testers 20 and 30 become g=0 and f=1, to indicate normality.

When the signals a and b have different values, e.g., (1, 0) or (0, 1), either the output signal of the transformer $T_1$ or that of $T_2$ becomes e=2. As a result, the output signal of the level tester 20 becomes g=1, and the output signal of the level tester 30 becomes f=0, to indicate normality same as the combinations of the signals a and b of (1, 1) or (0, 0).

Abnormality will be explained.

When all signals become 1, the output signals of the transformers $T_1$ to $T_4$ becomes each e=1. The outputs of the transformers $T_1$ and $T_2$ cancel each other, and the outputs of the transformers $T_3$ and $T_4$ cancel each other, so that output signals of the level testers 20 and 30 become g=0 and f=0 to indicate abnormality.

When all signals are 0, the output signals of the transformers $T_1$ to $T_4$ are each e=0 to cause the outputs g and f to be 0, thereby indicating abnormality.

In an abnormal state that the signal /a or /b becomes 1 when the signals a and b are each 1, the input levels of the level testers 20 and 30 each e=1, so that the output signals become g=0 and f=0, to indicate abnormality.

In this way, the outputs of the level testers 20 and 30 become g=0 and f=0 if the input signals are abnormal.

FIG. 10 shows a second embodiment.

This embodiment employs two transformers $T_5$ and $T_6$ and two level testers 20 and 30 that are the same as those of the first embodiment.

The transformer $T_5$ has four primary coils $L_1$ to $L_4$ and a secondary coil $L_0$ for generating an output e according to the sum of magnetic flux provided by the primary coils $L_1$ to $L_4$. The primary coils $L_1$ and $L_2$ correspond to the AND gate $AG_1$ and the primary coils $L_3$ and $L_4$ correspond to the AND gate $AG_2$. The primary coils $L_1$ and $L_2$ are oppositely wound from the primary coils $L_3$ and $L_4$. The primary coils $L_1$ and $L_2$ form a first coil group and the primary coils $L_3$ and $L_4$ form a secondary coil group. The transformer $T_5$ forms a third transformer.

The transformer $T_6$ has the same arrangement as the transformer $T_5$. The transformer $T_6$ has four primary coils $L_1$ to $L_4$ and a secondary coil $L_0$. The primary coils $L_1$ and $L_2$ correspond to the AND gate $AG_3$ and the primary coils $L_3$ and $L_4$ correspond to the AND gate $AG_4$. The primary coils $L_1$ and $L_2$ are oppositely wound from the primary coils $L_3$ and $L_4$. Similar to the transformer $T_5$, the transformer $T_6$ forms a third transformer, the primary coils $L_1$ and $L_2$ form a first coil group, and the primary coils $L_3$ and $L_4$ form a second coil group.

The operation of the embodiment will be explained.

When the signals a and b have the same value and are normal, the output signal of the secondary coil $L_0$ is e=2 due to the sum of magnetic flux of the primary coils $L_1$ and $L_2$ or the sum of magnetic flux of $L_3$ and $L_4$ of the transformer $T_6$. As a result, the output signals f becomes 1. At this time, the primary coils $L_1$ and $L_4$ or $L_2$ and $L_3$ of the transformer $T_5$ are excited. Since the primary coils $L_1$ and $L_4$ are oppositely wound to each other, the generated magnetic flux is cancelled to produce no output on the secondary coil $L_0$. Also, the primary coils $L_2$ and $L_3$ cause no output on the secondary coil $L_0$. Accordingly, the output signal g of the level tester 20 becomes 0, to indicate normality, similar to the first embodiment.

When the signals a and b have different values and are normal, the output signal of the transformer $T_5$ becomes e=2. Accordingly, the output signal of the level tester 20 becomes g=1, and the level tester 30 provides f=0, to indicate normality.

Abnormality will be explained.

When all signals become 1, the magnetic flux of the primary coils $L_1$ to $L_4$ is cancelled in each of the transformers $T_5$ and $T_6$ so that the secondary coils $L_0$ provide no output. As a result, the output signals of the level tester 20 and 30 are g=0 and f=0, to indicate abnormality.

When all signals are 0, the output signals of the transformers $T_5$ and $T_6$ are e=0. Accordingly, the output signals of the level testers 20 and 30 become g=0 and f=0 to indicate the abnormality.

In an abnormality that the signals a and b are each 1 and the signal /a or /b is 1, one of the excited three primary coils of each of the transformers $T_5$ and $T_6$ cancels the magnetic flux of the remaining two excited primary coils, so that the output level of the secondary coil $L_0$ becomes e<2. As a result, the output signals of the level testers 20 and 30 will be g=0 and f=0. In this way, the output signals of the level testers 20 and 30 always become g=0 and f=0 similar to the first embodiment, if the input signals are abnormal.

The arrangement of the second embodiment is able to halve the number of the transformers compared with the first embodiment, thereby make the circuit compact.

When input signals are normal in the first and second embodiments the phases of the output signals g and f of the level testers 20 and 30 become opposite to each other, to provide AC outputs having different phases 0 and $\pi$ depending on statuses of the input signals. If the circuit is arranged in the last stage, these output signals are rectified and used, to cause no problem. When the AC output signals g and f are used as binary input signals to a logic circuit in the next stage, it may cause a problem. Therefore, it is required to always provide AC outputs of the same phase irrespective of the statuses of input signals.

FIG. 11 shows the third embodiment to always provide outputs g and f having the same phase of level testers 20 and 30.

The circuit of FIG. 11 has four transformers $T_7$ to $T_{10}$ and two level testers 20 and 30.

Each of the transformer $T_7$ to $T_{10}$ has five primary coils $L_1$ to $L_5$ and a secondary coil $L_0$ for generating an output e in response to the sum of magnetic flux of the primary coils $L_1$ to $L_5$.

In each of the transformers $T_7$ and $T_8$, the primary coils $L_1$ and $L_2$ correspond to the AND gate $AG_1$, and the primary coils $L_3$ and $L_4$ correspond to the AND gate $AG_2$. The primary coils $L_1$ and $L_2$ and the primary coils $L_3$ and $L_4$ are wound in opposite directions. The secondary coils $L_0$ of the transformers $T_7$ and $T_8$ are wound in opposite directions. The primary coil $L_3$ in each of the transformers $T_7$ and $T_8$ receives a carrier signal $F_0$ of frequency $f_0$ generated by the signal generator B of FIG. 2. The primary coils $L_5$ are wound in opposite directions, and therefore, they receive the carrier signal $F_0$ in opposite phases. The transformers $T_7$ and $T_8$ form fourth and fifth transformers, respectively. In each of the transformers, the primary coils $L_1$ and $L_2$ form a third coil group, the primary coils $L_3$ and $L_4$ form a fourth coil group, and the primary coil $L_5$ forms a carrier signal input coil.

Each of the transformers $T_9$ and $T_{10}$ has the primary coils $L_1$ and $L_2$ corresponding to the AND gate $AG_3$, and the primary coils $L_3$ and $L_4$ corresponding to the AND gate $AG_4$. The other parts of them are the same as those of the transformers $T_7$ and $T_8$. Namely, except the combinations of the input signals, the transformers $T_9$ and $T_{10}$ are the same as the transformers $T_7$ and $T_5$. Namely, the transformers $T_9$ and $T_{10}$ correspond to the fourth and fifth transformers, respectively. In each of the transformers $T_9$ and $T_{10}$, the primary coils $L_1$ and $L_2$ correspond to the third coil group, the primary coils $L_3$ and $L_4$ correspond to the fourth coil group, and the primary coil $L_5$ corresponds to the carrier signal input coil.

The secondary output signal e of the transformers $T_7$ and $T_8$ are wired in an OR connection and are provided to the level tester 20. The secondary output signals e of the transformers $T_9$ and $T_{10}$ are wired in an OR connection and are provided to the level tester 30. In this way, the four transformers $T_7$ to $T_{10}$ to form an input signal processor.

The level testers 20 and 30 provide AC outputs of $g=1$ and $f=1$ when $e=3$. When $e<3$, $g=0$ and $f=0$.

The operation of the circuit will be explained.

When the input signals are normal and the signals a and b are (1, 1), the secondary coil $L_0$ of the transformer $T_9$ provides $e=3$ according to the sum of magnetic flux of the primary coils $L_1$, $L_2$, and $L_5$ thereof. In response to $e=3$, the level tester 30 provides $f=1$. When the signals /a and /b are (1, 1), the secondary coil $L_0$ of the transformer $T_{10}$ provides $e=3$ according to the sum of magnetic flux of the primary coils $L_1$, $L_2$, and $L_5$ thereof. If the magnetic flux of the primary coils $L_1$, $L_2$ and $L_5$ of the transformer $T_9$ has a phase 0, the magnetic flux of the primary coils $L_1$, $L_2$, and $L_5$ of the transformer $T_{10}$ has a phase $\pi$, which is opposite to the phase 0 of the transformer $T_9$. Since the secondary coil $L_0$ of the transformer $T_{10}$ is oppositely wound from the secondary coil $L_0$ of the transformer $T_9$, the output signal e of the secondary coil $L_0$ has the same phase as that of the transformer $T_9$. The in-phase output signals e are supplied to the level tester 30. Accordingly, the phase of the output signal f of the level tester 30 is unchanged irrespective of the statuses of the input signals. At this time, the output signals e of the transformers $T_7$ and $T_8$ are each $e<3$ in any case, so that the output signal g of the level tester 20 becomes 0, to indicate normality.

When the signals a and b represent different values, the output signal e of one of the transformers $T_7$ and $T_8$ becomes 3. Similar to the case mentioned above, the output signals e of the transformers $T_7$ and $T_8$ are in the same phase. The output signal g of the level tester 20 becomes 1, and the output signal f of the level tester 30 becomes 0, to indicate normality.

When the input signals are abnormal, the output signal e of each of the transformers $T_7$ to $T_{10}$ becomes $e<3$, so that the level testers 20 and 30 provide $g=0$ and $f=0$ to indicate abnormality.

According to this arrangement, the outputs g and f of the level testers 20 and 30 always have the same phase irrespective of the statuses of input signals. This is advantageous in connecting logic circuits in cascade.

The transformers of the logic circuits of FIGS. 9 to 11 may be formed with film patterns as shown in FIGS. 4(B) and 7, to integrate the logic circuits.

Figure 12:
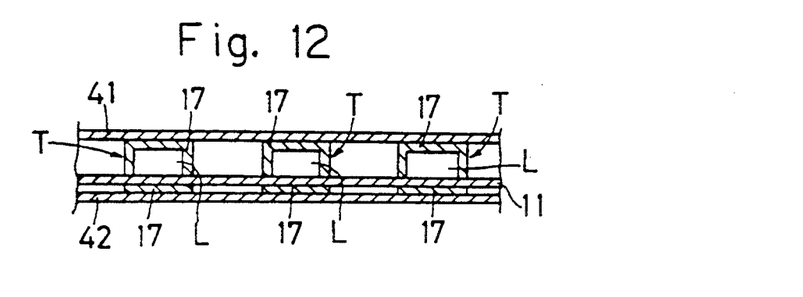
FIG. 12 is a section showing an arrangement of many transformers.

When a large number of the transformers shown in FIGS. 4(B) and 7 are arranged in an integrated circuit, adjacent transformers may be coupled together if they are too close to each other. In this case, the transformers must be covered with magnetic shields to prevent a leakage of magnetic flux. For this purpose, the coils shown in FIGS. 4(B) and 7 are covered with the magnetic layer 17. Forming the magnetic layer for covering the coils of each transformer may increase costs. FIG. 12 shows substitution for the magnetic layer.

Coils L are insulated from one another and are laminated on an insulation substrate 11. Presser plates 41 and 42 have each many magnetic shields 17 formed at positions corresponding to the coils L. The presser plates 41 and 42 are fitted to upper and lower faces of the insulation substrate 11, to entirely cover the coils L, thereby forming a transformer T.

As explained above, the logic circuit according to the present invention is more compact than a logic circuit employing capacitors for accumulating charges. Accordingly, a large number of the logic circuits can be integrated on a chip. Using a Schmitt circuit as a threshold circuit may provide a fail-safe structure with no power source outside process. This arrangement simplifies a circuit structure and is effective when connecting logic circuits in cascade since the output provided by the logic circuit is always in-phase.

CAPABILITY OF EXPLOITATION IN INDUSTRY

The present invention provides a compact logic circuit, improves circuit integration, and realizes a simple fail-safe logic circuit. Accordingly, the present invention has a great capability of exploitation in industry.

We claim:

1. An electromagnetically coupled fail-safe logic circuit comprising a transformer and a level tester, the transformer including a plurality of primary coils and a secondary coil, the primary coils being electromagnetically coupled to one another to receive a plurality of AC input signals, respectively, the AC input signals being in synchronism with one another and each representing a binary logic variable, i.e., a logic value of 1 corresponding to a high energy state or a logic value of 0 corresponding to a low energy state, the secondary coil being electromagnetically coupled with all of the primary coils, to provide an output corresponding to the sum of magnetic flux produced by the primary coils, the level tester with a threshold operation function carrying out a threshold operation of the level of the output of the secondary coil, and according to the operation result, providing an output representing the logic value 1 corresponding to the high energy state or the logic value 0 corresponding to the low energy state, the level tester providing an output representing the logic value 0 if failure occurs.

2. The electromagnetically coupled fail-safe logic circuit according to claim 1, wherein the input signals are modulated with a common carrier signal.

3. The electromagnetically coupled fail-safe logic circuit according to claim 1, wherein the level tester is made of a Schmitt circuit that provides an AC output when an input level to the level tester is greater than or equal to a predetermined threshold, and when the input level is smaller than the threshold, no output.

4. The electromagnetically coupled fail-safe logic circuit according to claim 1, wherein the level tester is made of a rectifier for rectifying the secondary output of the transformer and a window comparator that provides an AC output when the rectified output from the rectifier is between predetermined upper and lower limits, and when the rectified output is outside the limits, no output.

5. The electromagnetically coupled fail-safe logic circuit according to claim 1, wherein the transformer is made of a plurality of primary coils formed of film patterns that are covered with insulation material, insulated from one another, and laminated one upon another on an insulation substrate, a secondary coil formed of a film pattern that is covered with insulation material, insulated from the primary coil, and formed on the insulation substrate, and a magnetic layer covering the laminated primary coils and the secondary coil.

6. The electromagnetically coupled fail-safe logic circuit according to claim 5, wherein one terminal of each of the primary coils is kept at constant potential and the other terminal thereof receives an input signal, and wherein the primary coils are laminated one upon another such that the constant potential terminal of one of the adjacent primary coils and the input signal receiving terminal of the other of the adjacent primary coils are laid one upon another.

7. The electromagnetically coupled fail-safe logic circuit according to claim 5, wherein the primary and secondary coils are laminated on the same face of the insulation substrate.

8. The electromagnetically coupled fail-safe logic circuit according to claim 5, wherein the primary and secondary coils are formed on opposite faces of the insulation substrate.

9. The electromagnetically coupled fail safe logic circuit according to claim 8, wherein the magnetic layer is separated by the insulation substrate with the primary and secondary coils being formed on opposite faces of the substrate.

10. The electromagnetically coupled fail safe logic circuit according to claim 8, wherein the magnetic layer covers the insulation substrate and the primary and secondary coils, to form a continuous closed magnetic path when the primary and secondary coils are formed on opposite faces of the substrate.

11. The electromagnetically coupled fail-safe logic circuit according to claim 5, comprising a plurality of the transformers arranged on the insulation substrate and presser plates, the presser plates having magnetic layers and being attached to the insulation substrate from above and below the substrate so that the magnetic layers cover the primary and secondary coils of the transformers, the number of the magnetic layers corresponding to the number of the transformers.

12. An electromagnetically coupled fail-safe logic circuit comprising an input signal processor and a level tester, the input signal processor having coupled transformers for receiving a plurality of AC input signals each representing a binary logic variable, i.e., a logic value of 1 corresponding to a high energy state or a logic value of 0 corresponding to a low energy state, the input signals being synchronous to one another and divided into two groups, the input signal processor providing a first output signal according to the sum of in-phase magnetic flux produced by one group of the input signals and a second output signal according to the sum of in-phase magnetic flux produced by the other group of the input signals, the phase of the second output signal being opposite to that of the first output signal, the level tester testing the levels of the first and second output signals, and according to a result of the test, providing an output representing the logic value 1 corresponding to the high energy state or the logic value 0 corresponding to the low energy state, the level tester providing an output representing the logic value 0 if failure occurs.

13. The electromagnetically coupled fail-safe logic circuit according to claim 12, wherein the input signal processor has first and second transformers the first transformer having a plurality of electromagnetically coupled primary coils for receiving the input signals of one group, respectively, and a secondary coil electromagnetically connected to all of the primary coils, to provide an output according to the sum of magnetic flux generated by the primary coils, the second transformer having a plurality of electromagnetically coupled primary coils for receiving the input signals of the other group, respectively, and a secondary coil electromagnetically connected to all of the primary coils, to provide an output according to the sum of magnetic flux generated by the primary coils, the phase of the output of the secondary coil of the second transformer being opposite to that of the secondary coil of the first transformer, the secondary coils of the first and second transformers being connected to each other in series.

14. The electromagnetically coupled fail-safe logic circuit according to claim 12, wherein the input signal processor has a third transformer including a first primary coil group for receiving the input signals of one group and providing the sum of in-phase magnetic flux based on the input signals, a second primary coil group for receiving the input signals of the other group and providing the sum of magnetic flux based on the input signals, the phase of the magnetic flux of the second primary coil group being opposite to that of the first primary coil group, and a secondary coil electromagnetically coupled with both the primary coil groups.

15. An electromagnetically coupled fail-safe logic circuit comprising an input signal processor for receiving a plurality of AC input signals and a level tester, the input signals representing each a binary logic variable, i.e., a logic value of 1 corresponding to a high energy state or a logic value of 0 corresponding to a low energy state, divided into two groups, modulated with a common carrier signal, and being synchronous with one another, the input signal processor including fourth and fifth transformers, the fourth transformer including a third primary coil group, a fourth primary coil group, a carrier signal receiving primary coil, and a secondary coil, the third primary coil group receiving the input signals of one group and providing the sum of in-phase magnetic flux based on the input signals, the fourth primary coil group receiving the input signals of the other group and providing the sum of magnetic flux based on the input signals, the phase of the magnetic flux provided by the fourth primary coil group being opposite to the phase of the magnetic flux provided by the third primary coil group, the carrier signal receiving primary coil receiving the carrier signal and providing magnetic flux whose phase is the same as the phase of magnetic flux provided by the third primary coil group, the secondary coil being electromagnetically coupled with all of the primary coils and providing an output whose phase is the same as the phase of the magnetic flux provided by the third primary coil group, the fifth transformer including a fifth primary coil group, a sixth primary coil group, a carrier signal receiving primary coil, and a secondary coil, the fifth primary coil group receiving the input signals of one group and providing the sum of magnetic flux whose phase is the same as the phase of the magnetic flux provided by the third primary coil group of the fourth transformer, the sixth primary coil group receiving the input signals of the other group and providing the sum of magnetic flux whose phase is opposite to the phase of the magnetic flux provided by the fifth primary coil group, the carrier signal receiving primary coil receiving the carrier signal and providing magnetic flux whose phase is the same as the phase of the magnetic flux provided by the sixth primary coil group, the secondary coil being electromagnetically coupled with all of the primary coils and providing the sum of magnetic flux of the primary coils in the same phase as that of the secondary coil of the fourth transformer, output ends of the fourth and fifth transformers being connected to each of the in a wired OR arrangement, the level tester testing the level other wired OR output of the input signal processor, and according to the level, providing an output representing the logic value 1 corresponding to the high energy state or the logic value 0 corresponding to the low energy state, the level tester providing an output representing the logic value 0 when failure occurs.

* * * * *